United States Patent
Kirk et al.

(10) Patent No.: US 11,295,895 B2
(45) Date of Patent: Apr. 5, 2022

(54) INTEGRATED CAPACITOR FILTER AND INTEGRATED CAPACITOR FILTER WITH VARISTOR FUNCTION

(71) Applicant: AVX Corporation, Fountain Inn, SC (US)

(72) Inventors: Michael Kirk, Simponsville, SC (US); Marianne Berolini, Greenville, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 75 days.

(21) Appl. No.: 16/797,053

(22) Filed: Feb. 21, 2020

(65) Prior Publication Data
US 2020/0194180 A1 Jun. 18, 2020

Related U.S. Application Data

(63) Continuation of application No. 15/887,108, filed on Feb. 2, 2018, now Pat. No. 10,607,777.
(Continued)

(51) Int. Cl.
*H01G 4/228* (2006.01)
*H01G 4/005* (2006.01)
(Continued)

(52) U.S. Cl.
CPC .............. *H01G 4/228* (2013.01); *H01C 7/10* (2013.01); *H01C 7/1006* (2013.01); *H01C 7/18* (2013.01); *H01G 4/005* (2013.01); *H01G 4/012* (2013.01); *H01G 4/232* (2013.01); *H01G 4/30* (2013.01); *H01G 4/38* (2013.01); *H01G 4/40* (2013.01);
(Continued)

(58) Field of Classification Search
CPC ........ H01G 4/228; H01G 4/005; H01G 4/012; H01G 4/232; H01G 4/30; H01G 4/38; H01G 4/40; H01G 2/065; H01G 4/1245; H01G 4/1254; H01C 7/10; H01C 7/1006;
(Continued)

(56) References Cited

U.S. PATENT DOCUMENTS 5,870,273 A * 2/1999 Sogabe .................... H01G 4/40
361/306.3
5,909,350 A 6/1999 Anthony
(Continued)

FOREIGN PATENT DOCUMENTS

JP  S 619804 U   1/1986
JP  H 02304910 A  12/1990
(Continued)

OTHER PUBLICATIONS

International Search Report and Written Opinion for PCT/US2018/016825 dated Jun. 1, 2018, 13 pages.

*Primary Examiner* — Michael P McFadden
(74) *Attorney, Agent, or Firm* — Dority & Manning, P.A.

(57) ABSTRACT

Disclosed are apparatus and a method for providing an integrated multiterminal multilayer ceramic device that has three or more capacitive elements. Two of such capacitive elements may be in series, with a third in parallel. The integrated device may be packaged as an overmolded three leaded component, or can be mounted as SMD (surface mount device). The integrated device may also be combined with a separate varistor in a stacked arrangement of leaded components.

25 Claims, 8 Drawing Sheets

Related U.S. Application Data

(60) Provisional application No. 62/455,076, filed on Feb. 6, 2017.

(51) Int. Cl.
| | | |
|---|---|---|
| *H01C 7/10* | (2006.01) | |
| *H01G 4/30* | (2006.01) | |
| *H01C 7/18* | (2006.01) | |
| *H01G 4/232* | (2006.01) | |
| *H01G 4/40* | (2006.01) | |
| *H01G 4/012* | (2006.01) | |
| *H01G 4/38* | (2006.01) | |
| *H01G 4/12* | (2006.01) | |
| *H01G 2/06* | (2006.01) | |
| *H03H 1/00* | (2006.01) | |

(52) U.S. Cl.
CPC ........... *H01G 2/065* (2013.01); *H01G 4/1245* (2013.01); *H01G 4/1254* (2013.01); *H03H 2001/0014* (2013.01); *H03H 2001/0085* (2013.01)

(58) Field of Classification Search
CPC ............. H01C 7/18; H03H 2001/0014; H03H 2001/0085
See application file for complete search history.

(56) References Cited

U.S. PATENT DOCUMENTS

| | | |
|---|---|---|
| 6,018,448 A | 1/2000 | Anthony |
| 6,097,581 A | 8/2000 | Anthony |
| 6,157,528 A | 12/2000 | Anthony |
| 6,282,074 B1 | 8/2001 | Anthony |
| 6,373,673 B1 | 4/2002 | Anthony |
| 6,388,856 B1 | 5/2002 | Anthony |
| 6,469,595 B2 | 10/2002 | Anthony et al. |
| 6,498,710 B1 | 12/2002 | Anthony |
| 6,509,807 B1 | 1/2003 | Anthony et al. |
| 6,522,516 B2 | 2/2003 | Anthony |
| 6,549,389 B2 | 4/2003 | Anthony et al. |
| 6,563,688 B2 | 5/2003 | Anthony et al. |
| 6,580,595 B2 | 6/2003 | Anthony et al. |
| 6,594,128 B2 | 7/2003 | Anthony |
| 6,603,646 B2 | 8/2003 | Anthony et al. |
| 6,606,011 B2 | 8/2003 | Anthony et al. |
| 6,636,406 B1 | 10/2003 | Anthony |
| 6,650,525 B2 | 11/2003 | Anthony |
| 6,687,108 B1 | 2/2004 | Anthony et al. |
| 6,738,249 B1 | 5/2004 | Anthony et al. |
| 6,806,806 B2 | 10/2004 | Anthony |
| 6,816,356 B2 | 11/2004 | Devoe et al. |
| 6,822,845 B2 | 11/2004 | Chereson |
| 6,873,513 B2 | 3/2005 | Anthony |
| 6,914,500 B2 | 7/2005 | Hirabayashi |
| 6,950,293 B2 | 9/2005 | Anthony |
| 6,972,646 B2 | 12/2005 | Hirabayashi |
| 6,995,983 B1 | 2/2006 | Anthony et al. |
| 7,019,425 B2 | 3/2006 | Langguth et al. |
| 7,042,303 B2 | 5/2006 | Anthony et al. |
| 7,042,703 B2 | 5/2006 | Anthony et al. |
| 7,050,284 B2 | 5/2006 | Anthony |
| 7,110,227 B2 | 9/2006 | Anthony et al. |
| 7,113,383 B2 | 9/2006 | Anthony et al. |
| 7,141,899 B2 | 11/2006 | Anthony et al. |
| 7,180,718 B2 | 2/2007 | Anthony et al. |
| 7,193,831 B2 | 3/2007 | Anthony |
| 7,224,564 B2 | 5/2007 | Anthony |
| 7,262,949 B2 | 8/2007 | Anthony et al. |
| 7,274,549 B2 | 9/2007 | Anthony |
| 7,307,829 B1 | 12/2007 | Devoe et al. |
| 7,321,485 B2 | 1/2008 | Anthony et al. |
| 7,336,467 B2 | 2/2008 | Anthony et al. |
| 7,336,468 B2 | 2/2008 | Anthony et al. |
| 7,355,835 B2 | 4/2008 | Saitou et al. |
| 7,423,860 B2 | 9/2008 | Anthony et al. |
| 7,427,816 B2 | 9/2008 | Anthony et al. |
| 7,428,134 B2 | 9/2008 | Anthony |
| 7,433,168 B2 | 10/2008 | Anthony |
| 7,440,252 B2 | 10/2008 | Anthony |
| 7,443,647 B2 | 10/2008 | Anthony |
| 7,586,728 B2 | 9/2009 | Anthony |
| 7,593,208 B2 | 9/2009 | Anthony et al. |
| 7,609,500 B2 | 10/2009 | Anthony et al. |
| 7,609,501 B2 | 10/2009 | Anthony et al. |
| 7,630,188 B2 | 12/2009 | Anthony |
| 7,675,729 B2 | 3/2010 | Anthony et al. |
| 7,688,565 B2 | 3/2010 | Anthony et al. |
| 7,733,621 B2 | 6/2010 | Anthony et al. |
| 7,768,763 B2 | 8/2010 | Anthony et al. |
| 7,782,587 B2 | 8/2010 | Anthony et al. |
| 7,817,397 B2 | 10/2010 | Anthony |
| 7,894,176 B1 | 2/2011 | Anthony |
| 7,916,444 B2 | 3/2011 | Anthony et al. |
| 7,920,367 B2 | 4/2011 | Anthony et al. |
| 7,974,062 B2 | 7/2011 | Anthony et al. |
| 8,004,812 B2 | 8/2011 | Anthony et al. |
| 8,014,119 B2 | 9/2011 | Anthony |
| 8,018,706 B2 | 9/2011 | Anthony et al. |
| 8,023,241 B2 | 9/2011 | Anthony et al. |
| 8,026,777 B2 | 9/2011 | Anthony |
| 8,120,891 B2 | 2/2012 | Takashima et al. |
| 8,547,677 B2 | 10/2013 | Anthony et al. |
| 8,587,915 B2 | 11/2013 | Anthony et al. |
| 8,649,156 B2 | 2/2014 | Takashima et al. |
| 8,659,872 B2 | 2/2014 | Togashi |
| 9,001,486 B2 | 4/2015 | Anthony et al. |
| 9,019,679 B2 | 4/2015 | Anthony et al. |
| 9,025,306 B2 | 5/2015 | Togashi |
| 9,036,319 B2 | 5/2015 | Anthony et al. |
| 9,054,094 B2 | 6/2015 | Anthony et al. |
| 9,171,672 B2 | 10/2015 | McConnell et al. |
| 9,236,185 B1 | 1/2016 | Oguni |
| 9,373,592 B2 | 6/2016 | Anthony et al. |
| 9,397,632 B2 | 7/2016 | Tan et al. |
| 2003/0231457 A1 | 12/2003 | Ritter et al. |
| 2006/0157792 A1 | 7/2006 | Konushi |
| 2006/0176675 A1* | 8/2006 | Bourns .................. H01C 1/148 361/780 |
| 2007/0035911 A1 | 2/2007 | Eggerding et al. |
| 2009/0077800 A1 | 3/2009 | Randall et al. |
| 2009/0147440 A1 | 6/2009 | Cygan et al. |
| 2011/0317327 A1 | 12/2011 | Ahn et al. |
| 2012/0244728 A1 | 9/2012 | Rathburn |
| 2016/0013770 A1 | 1/2016 | Sata et al. |
| 2016/0293335 A1* | 10/2016 | Adachi .................. H01G 4/40 |
| 2016/0343504 A1* | 11/2016 | Ando ...................... H01G 4/40 |
| 2017/0169956 A1 | 6/2017 | Miller et al. |
| 2017/0316882 A1* | 11/2017 | Park ...................... H01G 4/012 |
| 2020/0111611 A1* | 4/2020 | Park ........................ H01G 2/22 |

FOREIGN PATENT DOCUMENTS

| | | |
|---|---|---|
| JP | H 03206606 A | 9/1991 |
| JP | 2000299249 A | 10/2000 |
| JP | 3640273 B2 | 4/2005 |
| JP | 2006310652 A | 11/2006 |
| JP | 4030180 B2 | 1/2008 |
| JP | 4050742 B2 | 2/2008 |
| JP | 2014187102 A | 10/2014 |
| JP | 2016192472 A | 11/2016 |
| KR | 20060106180 | 12/2006 |
| KR | 20100049846 | 5/2010 |

* cited by examiner

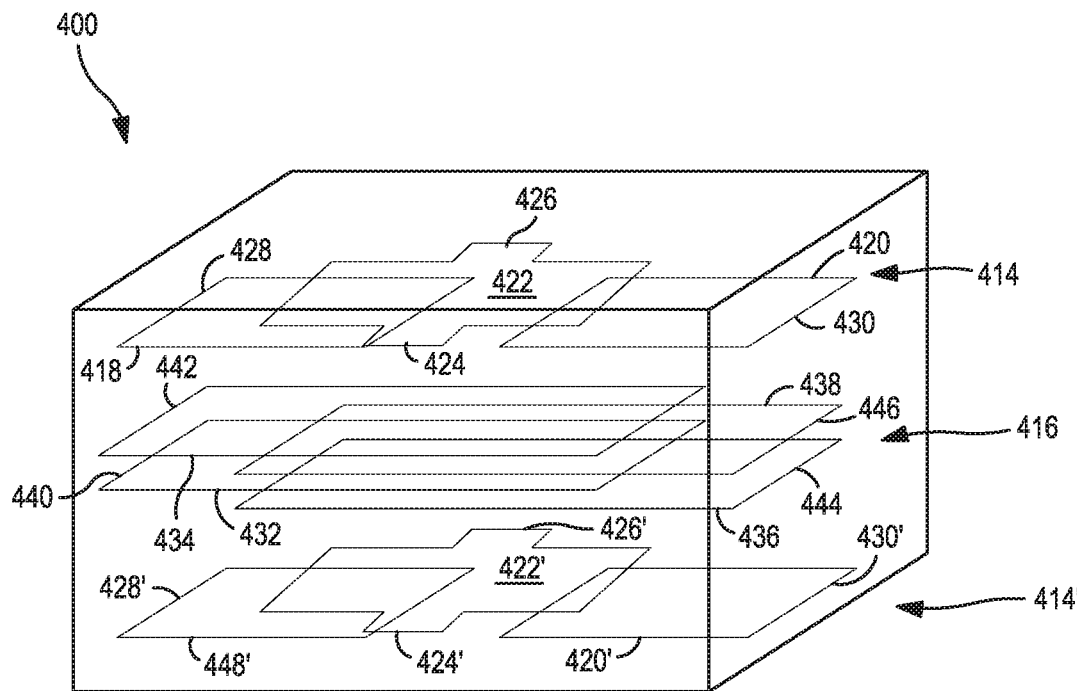
FIG. 4A
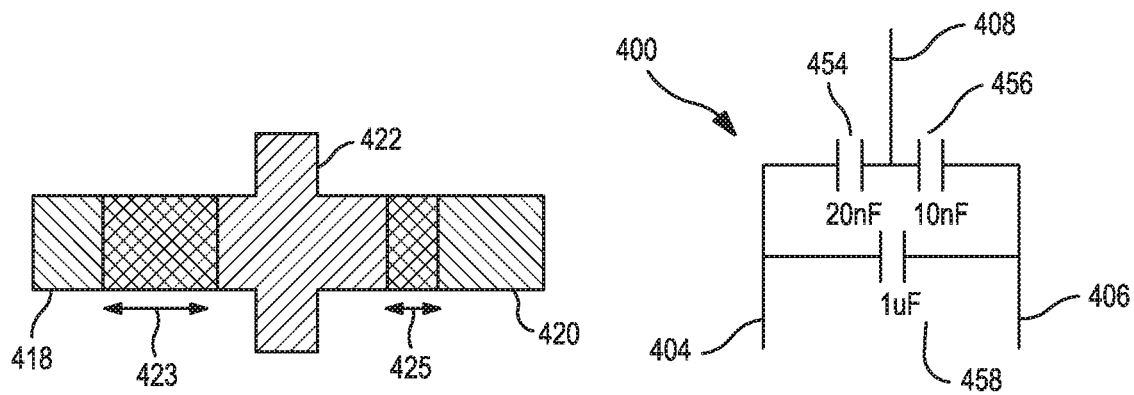
FIG. 4B  FIG. 4C

INTEGRATED CAPACITOR FILTER AND INTEGRATED CAPACITOR FILTER WITH VARISTOR FUNCTION

CROSS REFERENCE TO RELATED APPLICATION

The present application is a continuation of U.S. application Ser. No. 15/887,108 having a filing date of Feb. 2, 2018, which claims filing benefit of U.S. Provisional Patent Application Ser. No. 62/455,076 having a filing date of Feb. 6, 2017, and which are incorporated herein by reference in their entirety.

BACKGROUND OF THE SUBJECT MATTER

For some time, the design of various electronic components has been driven by a general industry trend toward miniaturization, as well as increased functionality. In such regard, a need exists for ever smaller electronic components having improved operating characteristics. For example, some applications would benefit from the equivalent of multiple components, but are severely limited in the amount of space such electronic components may occupy on a circuit board.

Multilayer ceramic devices, such as multilayer ceramic capacitors or varistors, are sometimes constructed with a plurality of dielectric-electrode layers arranged in a stack. During manufacture, the layers may be pressed and formed into a vertically stacked structure. Multilayer ceramic devices can include a single element or multiple elements. Examples of prior issued U.S. Patents or U.S. Patent Application Publications include: U.S. Pat. Nos. 9,025,306; 7,307,829; and 5,870,273; and U.S. Patent Application Publication Nos. 20120188681; 20090154055; 20090147440; and 20060262490, all of which are hereby incorporated by reference into this disclosure for all purposes, and as if fully set forth herein.

It would be advantageous, therefore, if devices and corresponding method could be provided that result in improved miniaturization, as well as increased functionality and/or operational characteristics.

SUMMARY OF THE SUBJECT MATTER

In accordance with one embodiment of the present invention, a multiterminal multilayer ceramic device with multiple capacitive elements is disclosed. The multiterminal multilayer ceramic device comprises: a body having cooperating multiple layers including electrode layers to form integrated capacitive structures; a first region of said electrode layers forming a split feedthrough type construction of two respective capacitors; a second region of said electrode layers forming an overlap type construction of a multilayer ceramic capacitor; a first pair of terminations external to said body and having opposite polarity; and a second pair of terminations external to said body and having the same polarity; wherein said first pair of terminations is in series connection with said second region capacitor, and said first pair of terminations and at least one of said second pair of terminations are in respective parallel connections with said two respective capacitors of said first region, so that multiple capacitive elements are integrated in a single package device.

In accordance with another embodiment of the present invention, an integrated capacitor filter with varistor functionality is disclosed. The Integrated capacitor filter comprises: a discrete multiterminal multilayer ceramic capacitor device with multiple capacitive elements, comprising a body having cooperating multiple layers including electrode layers which in turn form integrated capacitive structures; a first pair of capacitor device terminations external to said body and having opposite polarity; a second pair of capacitor device terminations external to said body and having the same polarity; a first region of said electrode layers forming two respective capacitors; and a second region of said electrode layers forming a multilayer ceramic capacitor received in series connection between said first pair of terminations; a discrete varistor comprising a body having a pair of varistor terminations external to said varistor body and having opposite polarity; first and second leads respectively attached to said first pair of capacitor device terminations and said pair of varistor terminations; and a third lead attached to at least one of said second pair of capacitor device terminations.

In accordance with another embodiment of the present invention, a method for providing a multiterminal multilayer ceramic device with multiple capacitive elements is disclosed. The method comprises the following steps: providing a body having cooperating multiple layers including electrode layers which are used to form integrated capacitive structures; forming a split feedthrough type construction of two respective capacitors in a designated first region of said electrode layers; forming an overlap type construction of a multilayer ceramic capacitor in a designated second region of said electrode layers; applying a first pair of terminations external to a pair of respective opposing sides of said body, and with said second region capacitor connected in series between said first pair of terminations; and applying a second pair of terminations external to at least portions of another pair of respective opposing sides of said body and having the same polarity, and with at least one of said second pair of terminations and said first pair of terminations in respective parallel connections with said two respective capacitors of said first region, so that multiple capacitive elements are integrated in a single package device.

Other features and aspects of the present invention are discussed in greater detail below.

BRIEF DESCRIPTION OF THE DRAWINGS

A full and enabling disclosure of the presently disclosed subject matter, including the best mode thereof, directed to one of ordinary skill in the art, is set forth in the specification, which makes reference to the appended figures, in which:

FIG. 4A illustrates a perspective view of yet another exemplary embodiment of presently disclosed subject matter, with partial transparent view to illustrate multiple components formed by multilayer construction therein;

FIG. 4B illustrates a top elevation view of selected layers within the multilayer construction of the exemplary embodiment of FIG. 4A;

FIG. 4C illustrates a schematic view of the exemplary embodiment of application FIG. 4A;

Figure 1A:
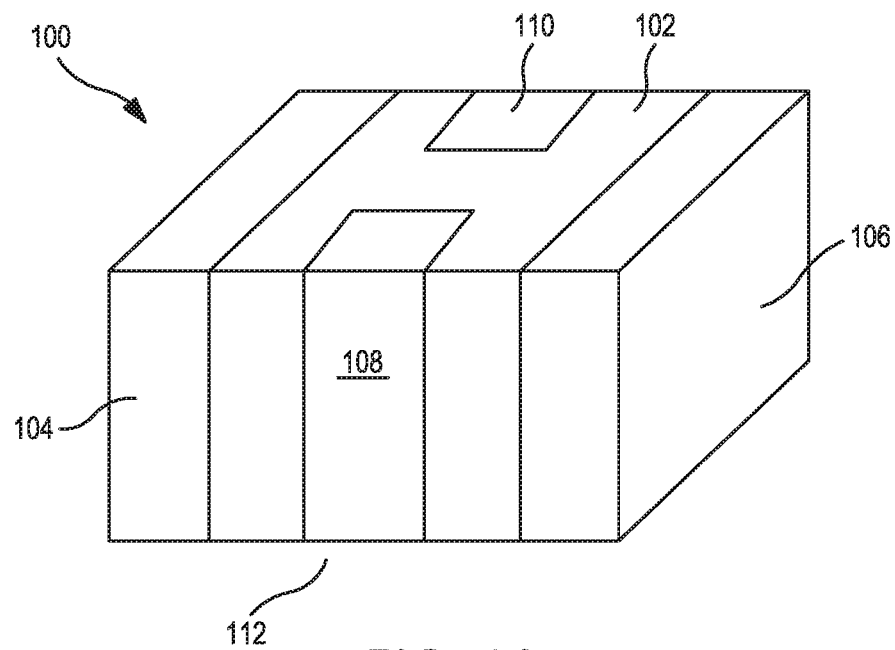
FIG. 1A illustrates an external perspective view of an exemplary embodiment of a multiterminal multilayer device in accordance with presently disclosed subject matter, for use such as for an SMD configuration.

Repeat use of reference characters throughout the present specification and appended drawings is intended to represent same or analogous features, elements, or steps thereof.

DETAILED DESCRIPTION OF THE SUBJECT MATTER

Reference now will be made in detail to various embodiments of the invention, one or more examples of which are set forth below. Each example is provided by way of explanation of the invention, not limitation of the invention. In fact, it will be apparent to those skilled in the art that various modifications and variations may be made in the present invention without departing from the scope or spirit of the invention. For instance, features illustrated or described as part of one embodiment, may be used on another embodiment to yield a still further embodiment. Thus, it is intended that the present invention covers such modifications and variations as come within the scope of the appended claims and their equivalents.

Generally speaking, the present invention is directed to filter devices, such as integrated capacitor filters and in particular those with varistor functionality. In general, a multiterminal multilayer ceramic device is provided. In one embodiment, the device may be provided with a discrete varistor.

In general, a multilayer ceramic device, such as a multilayer ceramic capacitor, can include a ceramic body with external electrodes. The ceramic body is fabricated by sintering a laminated body formed of alternately stacked dielectric layers and internal electrodes. Each pair of neighboring internal electrodes faces each other with a dielectric layer intervened therebetween and is electrically coupled to different external electrodes, respectively.

In general, the dielectric layers can be made of any material generally employed in the art. For instance, the dielectric layer can be made of a ceramic material including a titanate as a primary component. The titanate may include but is not limited to, barium titanate ($BaTiO_3$). The ceramic material may also contain an oxide of a rare-earth metal and/or a compound of such acceptor type element as Mn, V, Cr, Mo, Fe, Ni, Cu, Co, or the like. The titanate may also contain MgO, CaO, $Mn_3O_4$, $Y_2O_3$, $V_2O_5$, ZnO, $ZrO_2$, $Nb_2O_5$, $Cr_2O_3$, $Fe_2O_3$, $P_2O_5$, SrO, $Na_2O$, $K_2O$, $Li_2O$, $SiO_2$, $WO_3$ or the like. The ceramic material may also include other additives, organic solvents, plasticizers, binders, dispersing agents, or the like in addition to ceramic powder.

In general, the internal electrodes can be made of any material generally employed in the art. For instance, the internal electrodes can be formed by sintering a conductive paste whose main component is a noble metal material. These materials can include, but are not limited to, palladium, palladium-silver alloy, nickel, and copper. For instance, in one embodiment, the electrodes may be made of nickel or a nickel alloy. The alloy may contain one or more of Mn, Cr, Co, Al, W and the like, and an Ni content in the alloy is preferably 95% by weight or more. The Ni or Ni alloy may contain 0.1% by weight or less of various microamount components such as P, C, Nb, Fe, Cl, B, Li, Na, K, F, S and the like.

The ceramic body can be formed using any method generally known in the art. For instance, the ceramic body can be formed by forming a laminated body with alternately stacked ceramic sheets and patterned internal electrodes, removing a binder off the laminated body, sintering the binder removed laminated body in a non-oxidative atmosphere at a high temperature ranging from 1200° C. to 1300° C., and re-oxidizing the sintered laminated body in the oxidative atmosphere.

In general, a varistor, can include a ceramic body with external electrodes. The ceramic body is fabricated by sintering a laminated body formed of alternately stacked ceramic layers and internal electrodes. Each pair of neighboring internal electrodes faces each other with a ceramic layer intervened therebetween and is electrically coupled to different external electrodes, respectively.

In general, the ceramic layers can be made of any material generally employed in the art. For instance, the ceramic layers can be made from a metal oxide. In particular, the metal oxide may include zinc oxide and may also include other oxides, such as those of bismuth, cobalt, antimony, manganese, chromium, boron, and/or tin.

In general, the internal electrodes can be made of any material generally employed in the art. For instance, the internal electrodes can be formed by sintering a conductive paste whose main component is a noble metal material. These materials can include, but are not limited to, palladium, palladium-silver alloy, silver, nickel, and copper. For instance, in one embodiment, the electrodes may be made of nickel or a nickel alloy. The alloy may contain one or more of Mn, Cr, Co, Al, W and the like, and an Ni content in the alloy is preferably 95% by weight or more. The Ni or Ni alloy may contain 0.1% by weight or less of various microamount components such as P, C, Nb, Fe, Cl, B, Li, Na, K, F, S and the like.

Without intending to be limited by theory, a capacitor is an electrical component that stores electrical energy in an electric field. Without intending to be limited by theory, a varistor is an electrical component that has an electrical resistance that can vary with the applied voltage thereby rendering it a voltage-dependent resistor. In combination, a capacitor and resistor can provide an RC circuit or filter.

In one embodiment, a multiterminal multilayer ceramic device is provided with three or more capacitive elements. The three capacitors may involve two capacitors in series, which are in parallel with in turn a third element. The device may also be provided in parallel with a discrete varistor. The multiterminal multilayer ceramic device may be a cofired device and/or the discrete varistor may be a discrete cofired varistor.

In one embodiment, the devices of the present disclosure may be packaged in overmolded three leaded components. In another embodiment, they may alternatively be mounted as surface mount devices (SMD). With regards to the former, it may provide an advantage in that it may simply assembly by replacing three single discrete caps with a single integrated capacitive device. With regards to the latter, it may provide an advantage in that it may result in replacement of multiple discrete components on a printed circuit board (PCB), thereby saving space and in some instances lowering inductance.

Some presently disclosed exemplary embodiments result in integration of capacitive elements in a single cofired package. For yet other alternatives, the addition of a varistor element provides transient protection.

Additionally, other advantages may also exist. For instance, a substantial reduction in device size can be obtained, which can result in a reduction in the number of solder joints, which correspondingly increases reliability. Another facet is that the resulting integrated device can have much lower parasitic inductance than the corresponding number of discrete devices. Furthermore, lead wires allow an exemplary device to be installed within an electric motor housing. Also, such device could also be made as SMD.

Another aspect of the present disclosure is that EMI and EMI/ESD circuit protection can be obtained, which may be especially useful for particular applications, such as for automotive applications. The presently disclosed subject matter may also be useful for motor start-stop applications.

One embodiment of the present disclosure relates to a multiterminal multilayer ceramic device, such as a multiterminal cofired multilayer ceramic device, with multiple capacitive elements. The device comprises a body, such as a six-sided generally rectangular body, having cooperating multiple layers including electrode layers which in turn form integrated capacitive structures; a first region of such electrode layers forming a split feedthrough type construction of two respective capacitors; a second region of such electrode layers forming an overlap type construction of a multilayer ceramic capacitor; a first pair of terminations external to such body and having opposite polarity; and a second pair of terminations external to such body and having the same polarity. Further, preferably such first pair of terminations is in series connection with such second region capacitor, and such first pair of terminations and at least one of such second pair of terminations are in respective parallel connections with such two respective capacitors of such first region, so that multiple capacitive elements are integrated in a single package device, such as a single package cofired device.

In one embodiment, such first region of such electrode layers may comprise at least a pair of layers, such as generally rectangular layers, situated opposite a generally cross-shaped layer having respective front and back extending edges in respective contact with such second pair of terminations, and having side extending edges in respective contact with such first pair of terminations.

In another embodiment, such second region of such electrode layers may comprise at least paired alternating layers in an overlapped configuration with respective extending portions thereof in contact with respective of such first pair of terminations.

In one embodiment, such two respective capacitors of such first region may be in series with each other, and both in parallel with such multilayer ceramic capacitor of such second region.

In another embodiment, such first and second pairs of terminations may be situated on respective opposing-side pairs of sides of such body, and respectively wrap-around therefrom to a designated bottom side of such body, for forming a surface mount device (SMD) configuration for such device.

In accordance with one embodiment, first and second leads may be respectively attached to such first pair of terminations, and a third lead may be attached to at least one of such second pair of terminations.

In accordance with another embodiment, such a multiterminal multilayer ceramic device may further comprise a third region of such electrode layers forming a split feedthrough type construction of an additional two respective capacitors. Per such alternative, such first pair of terminations and at least one of such second pair of terminations may be in respective parallel connections with such additional two respective capacitors of such third region.

In yet another embodiment, such second region of such electrode layers may be between such first and third regions of such electrode layers. Per other variations, such body may have a pair of relatively elongated sides and a pair of relatively shorter sides; such first pair of terminations may reside respectively on such pair of relatively elongated sides; and such second pair of terminations may reside respectively on such pair of relatively shorter sides.

For some embodiments, such pair of layers, such as generally rectangular layers, of such first layer may have respectively different overlap areas with such generally cross-shaped layer of such first layer so that different capacitance values may result for such respective capacitors of such first region. For others, such an exemplary multiterminal multilayer ceramic device may further comprise a third region of such electrode layers forming a split feedthrough type construction of an additional two respective capacitors, such third region comprising at least a pair of layers, such as generally rectangular layers, having respective front and back extending edges in respective contact with such second pair of terminations, and having side extending edges in respective contact with such first pair of terminations. In some embodiments, such pair of layers, such as generally rectangular layers, of such third layer may have respectively different overlap areas with such generally cross-shaped layer of such third layer so that different capacitance values result for such respective additional capacitors of such third region.

In one embodiment, such electrode layers of such second region may include relatively enlarged areas for forming a relatively increased capacitance value overlap type multilayer ceramic capacitor.

In one embodiment, a discrete varistor with a pair of external terminations may be stacked relative to such device, with such first and second leads respectively attached to such pair of external terminations of such varistor so that such device and such discrete varistor are connected in parallel.

Another exemplary embodiment in accordance with presently disclosed subject matter preferably relates to an integrated capacitor filter with varistor functionality, comprising a discrete multiterminal multilayer ceramic capacitor device, such as a cofired multilayer ceramic capacitor device, with multiple capacitive elements, comprising a body, such as a six-sided generally rectangular, having cooperating multiple layers including electrode layers which in turn form integrated capacitive structures; a first pair of capacitor device terminations external to such body and having opposite polarity; a second pair of capacitor device terminations external to such body and having the same polarity; a first region of such electrode layers forming two respective capacitors; and a second region of such electrode layers forming a multilayer ceramic capacitor received in series connection between such first pair of terminations. Such discrete multiterminal multilayer ceramic capacitor device is preferably further combined with a discrete varistor, such as a discrete cofired varistor, comprising a body, such as a six-sided generally rectangular, having a pair of varistor terminations external to such varistor body and having opposite polarity; first and second leads respectively attached to such first pair of capacitor device terminations and such pair of varistor terminations; and a third lead attached to at least one of such second pair of capacitor device terminations.

In one embodiment, such first pair of capacitor device terminations and at least one of such second pair of capacitor device terminations may be in respective parallel connections with such two respective capacitors of such first region. In another embodiment, such first region of such electrode layers may form a split feedthrough type construction of such two respective capacitors; and such second region of such electrode layers may form an overlap type construction of such multilayer ceramic capacitor.

In accordance with another embodiment, a method is provided, including for example, for production of such devices. For example, one exemplary embodiment of presently disclosed subject matter relates to a method for providing a multiterminal multilayer ceramic device, such as a cofired multilayer ceramic device, with multiple capacitive elements. Such method comprises providing a body, such as a six-sided generally rectangular, having cooperating multiple layers including electrode layers which are used to form integrated capacitive structures; forming a split feedthrough type construction of two respective capacitors in a designated first region of such electrode layers; forming an overlap type construction of a multilayer ceramic capacitor in a designated second region of such electrode layers; applying a first pair of terminations external to a pair of respective opposing sides of such body, and with such second region capacitor connected in series between such first pair of terminations; and applying a second pair of terminations external to at least portions of another pair of respective opposing sides of such body and having the same polarity, and with at least one of such second pair of terminations and such first pair of terminations in respective parallel connections with such two respective capacitors of such first region, so that multiple capacitive elements are integrated in a single package device, such as a single package cofired device.

In one embodiment, such first region of such electrode layers may comprise at least a pair of layers, such as generally rectangular layers, situated opposite a generally cross-shaped layer having respective front and back extending edges in respective contact with such second pair of terminations, and having side extending edges in respective contact with such first pair of terminations; and such second region of such electrode layers may comprise at least paired alternating layers in an overlapped configuration with respective extending portions thereof in contact with respective of such first pair of terminations.

For one embodiment, wherein such first and second pairs of terminations may respectively wrap-around to a designated bottom side of such body, for forming a surface mount device (SMD) configuration for such device.

For one embodiment, the method may further comprise forming another split feedthrough type construction of two respective capacitors in a designated third region of such electrode layers, with such two respective capacitors of such third region connected respectively in parallel relative to at least one of such second pair of terminations and such first pair of terminations.

In one embodiment, the method may comprise providing such pair of layers, such as generally rectangular layers, of such first layer with respectively different overlap areas with such generally cross-shaped layer of such first layer so that different capacitance values result for such respective capacitors of such first region.

The method may also further comprise forming a split feedthrough type construction of an additional two respective capacitors in a designated third region of such electrode layers, such third region comprising at least a pair of layers, such as generally rectangular layers, having respective front and back extending edges in respective contact with such second pair of terminations, and having side extending edges in respective contact with such first pair of terminations.

In one embodiment, the method may further include attaching first and second leads respectively to such first pair of terminations, and attaching a third lead to at least one of such second pair of terminations. In one embodiment, the method may yet further include stacking relative to such device a discrete varistor with a pair of external terminations, with such first and second leads respectively attached to such pair of external terminations of such varistor so that such device and such discrete varistor are connected in parallel.

FIG. 1A illustrates an external perspective view of an exemplary embodiment of a multiterminal multilayer device generally 100 in accordance with presently disclosed subject matter. As illustrated, the exemplary embodiment 100 generally has a body, such as a six-sided body, generally 102, with external terminations 104, 106, 108, and 110. All such external terminations present on a designated bottom side generally 112 of device 100, for use such as in a surface mount device (SMD) configuration.

Device 100 in the exemplary embodiment illustrated may comprise a multiterminal multilayer ceramic device which is provided with three or more capacitive elements. In some such embodiments, such three capacitors may involve two capacitors in series, which are in parallel with a third element. As understood by those of ordinary skill in the art relative to all embodiments described herein, cooperating layers in the subject multilayer constructions comprise electrode layers which in turn form integrated capacitive structures.

Figure 1B:
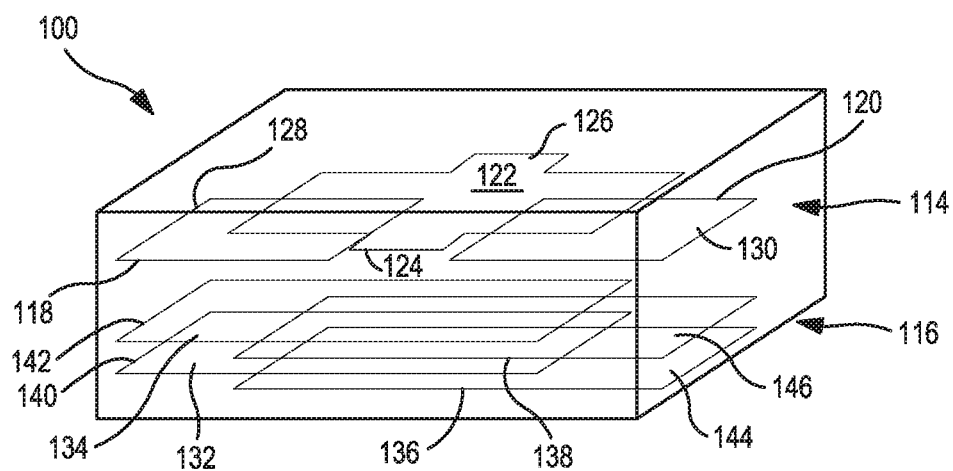
FIG. 1B illustrates a perspective view of the exemplary embodiment of application FIG. 1A, with partial transparent view to illustrate multiple components formed by multilayer construction therein.

FIG. 1B illustrates a perspective view of the exemplary embodiment generally 100 of application FIG. 1A, with partial transparent view to illustrate multiple components formed by multilayer construction therein. More specifically, as shown in such FIG. 1B, an upper or first region generally 114 of device 100 internally provides a split feedthrough type construction resulting in two respective exemplary capacitors, while a lower or second region generally 116 of device 100 internally provides more of a standard overlap multilayer capacitor construction. Thus, the representative exemplary embodiment of present FIGS. 1A and 1B result in integration of capacitive elements in a single package, such as a single cofired package.

More specifically, regarding upper region 114, a pair of layers 118 and 120, such as generally rectangular layers 118 and 120, is juxtaposed opposite a representative cross-shaped layer 122. As represented, front and back extending edges 124 and 126 of layer 122 are in respective contact with central (or second pair of) external terminations 108 and 110, while side extending edges 128 and 130 are in respective contact with side/end (or first pair of) terminations 104 and 106.

Regarding lower region 116, paired alternating layers 132/134 and 136/138 are in standard overlapped configuration for formation of a multilayer capacitor within such region 116 of device 100. Also as shown, respective ends thereof 140 and 142 are in contact with external end termination 104, while respective ends thereof 144 and 146 are in contact with external end termination 106.

Figure 1C:
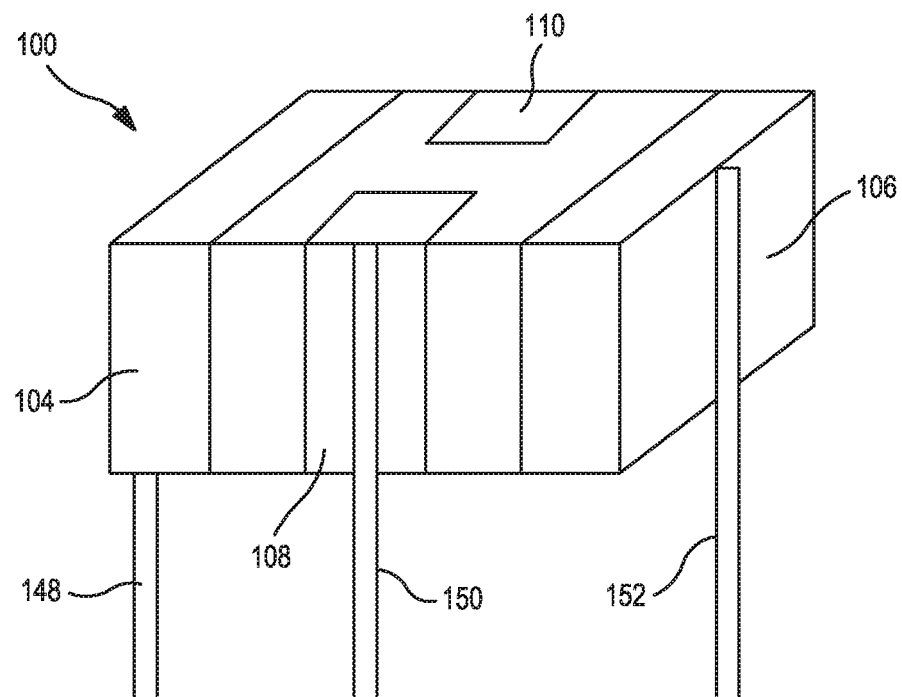
FIG. 1C illustrates a perspective view of the exemplary embodiment of application FIG. 1A, with added lead configuration.

FIG. 1C illustrates a perspective view of the exemplary embodiment 100 of application FIG. 1A, with added lead configuration. More specifically, leads 148, 150, and 152 are respectively attached to external terminations 104, 108, and 106. Leads 148 and 152 may constitute first and second leads respectively attached to the first pair of terminations 104 and 106, while lead 150 may constitute a third lead attached to at least one of the second pair of terminations 108 and 110. Those of ordinary skill in the art will also understand that terminations 108 and 110 are both connected to layer 122 of upper region 114 of device 100, such that lead 150 may be connected with either such termination 108 or 110 with the same electrical circuitry consequences. The resulting configuration of application FIG. 1C is an overmolded three leaded component.

Figure 1D:
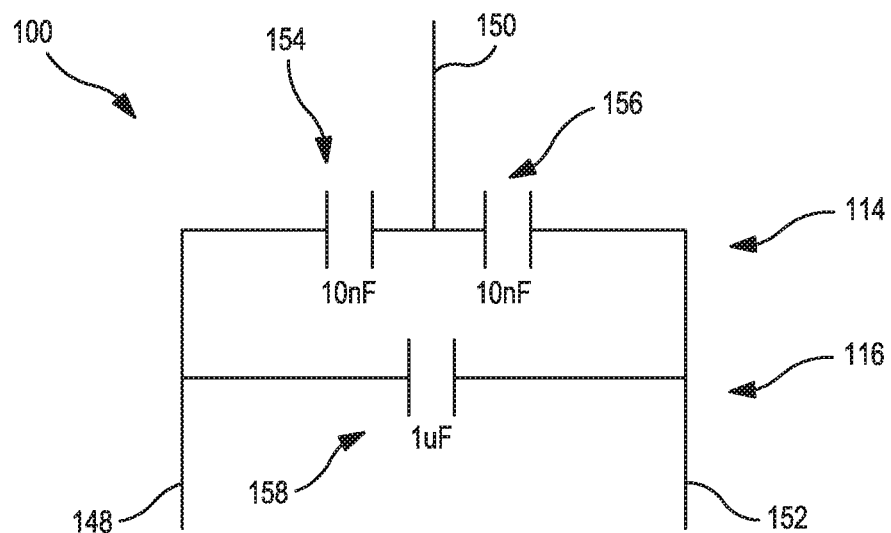
FIG. 1D illustrates a schematic view of the exemplary embodiment of application FIG. 1A.

FIG. 1D illustrates a schematic view of the exemplary embodiment generally 100 of application FIG. 1A, in the connection/mounting configuration thereof as shown by application FIG. 1C. More specifically, leads 148, 150, and 152 are shown in respective contact with series and parallel capacitors. The indicated capacitance values are intended as exemplary only, rather than limiting.

As illustrated, device 100 provides a single device solution for containing series and parallel capacitors. Upper region generally 114 of device 100 shows two representative 10 nF capacitors 154 and 156 formed by the split feedthrough configuration of representative layers 118, 122, and 130. Lower region generally 116 of device 100 shows a single representative 1 µF capacitor 158, such as would be formed from standard multilayer capacitor constructions.

While various sizes may be practiced for any of the exemplary embodiments disclosed herewith, device 100 may be regarded as being representative of a standard MLC case size, for example, a 1206 case size. Of course, various sizes may be practiced in various embodiments, as needed or desired for a particular application. All such variations and variations of exemplary capacitance values are intended to come with the spirit and scope of the presently disclosed subject matter. Otherwise, device 100 in accordance with the presently disclosed subject matter represents an integrated three-terminal device with a standard multilayer capacitor (MLC) in a designated lower region thereof combined with a split feedthrough in a designated upper region thereof. From a method perspective, device 100 (integrated multiple capacitive elements in a single package) in accordance with its description and uses herein, simplifies assembly of a leaded or SMD component by replacing three single discrete capacitors with a single integrated capacitive device. Particularly when used in an SMD configuration, multiple discrete components are avoided on a PCB, which saves space on the PCB while lowering inductance.

Figure 2:
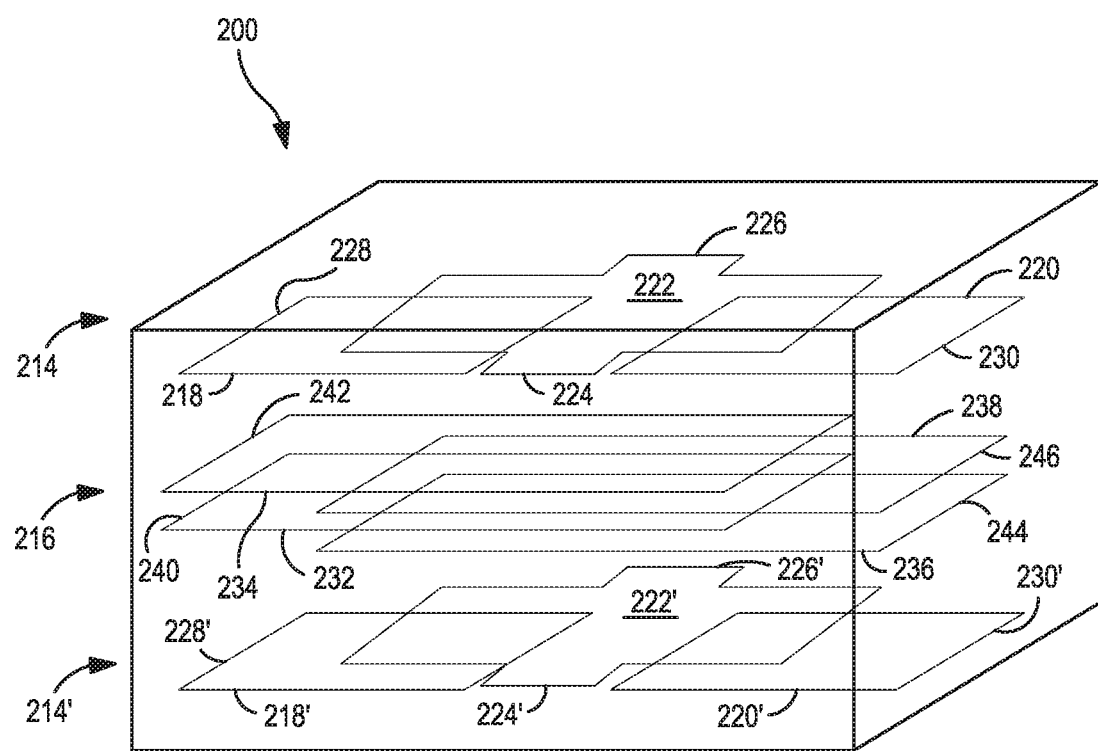
FIG. 2 illustrates a perspective view of another exemplary embodiment of presently disclosed subject matter, with partial transparent view to illustrate multiple components formed by multilayer construction therein.

FIG. 2 illustrates a perspective view of another exemplary embodiment generally 200 of presently disclosed subject matter. FIG. 2 provides a partially transparent view, similar to application FIG. 1B, to illustrate multiple components formed by multilayer construction therein. More specifically, device 200 has a pair of series capacitors situated in a generally upper region 214 as well as a similar pair of series capacitors situated in a generally lower region 214', with regions 214 and 214' on either side of a central region generally 216 in which a single capacitor in parallel is formed. Accordingly, those of ordinary skill in the art will appreciate from the complete disclosure herewith that the internally configured embodiment of device 200 of application FIG. 2 may nonetheless be also used with a standard package size (or other) and external termination configuration as represented by application FIG. 1A.

More specifically, as shown in such FIG. 2, upper and lower (first and third) regions generally 214 and 214' of device 200 internally provide respective split feedthrough type constructions resulting in two pairs of respective exemplary capacitors, while central or middle (second) region generally 216 of device 200 between regions 214 and 214' internally provides more of a standard overlap multilayer capacitor construction. Thus, the representative exemplary embodiment of present FIG. 2 results in another exemplary embodiment of presently disclosed integration of capacitive elements in a single package, such as a single cofired package.

More specifically, regarding upper region 214, a pair of layers 218 and 220, such as generally rectangular co-planar layers 218 and 220, is juxtaposed opposite a representative cross-shaped layer 222. As represented, front and back extending edges 224 and 226 of layer 222 would be in respective contact with central external terminations 108 and 110 (of application FIG. 1A), while side extending edges 228 and 230 are in respective contact with side/end terminations 104 and 106 (of application FIG. 1A). Similarly, regarding lower region 214', a pair of layers 218' and 220', such as generally rectangular layers 218' and 220', are juxtaposed opposite a representative cross-shaped layer 222'. As represented, front and back extending edges 224' and 226' of layer 222' would be in respective contact with central external terminations 108 and 110 (of application FIG. 1A), while side extending edges 228' and 230' are in respective contact with side/end terminations 104 and 106 (of application FIG. 1A).

Regarding middle or central region 216, paired alternating layers 232/234 and 236/238 are in standard overlapped configuration for formation of a multilayer capacitor within such region 216 of device 200. Also as shown, respective ends thereof 240 and 242 are in contact with external end termination 104 (of application FIG. 1A), while respective ends thereof 244 and 246 are in contact with external end termination 106 (of application FIG. 1A).

Similar to the potential alternative mounting of application embodiment 100 of FIG. 1A in a leaded configuration of application FIG. 1C, device 200 of application FIG. 2 may be mounted as a surface mount device, or associated with leads in the configuration of application FIG. 1C.

Figure 3A:
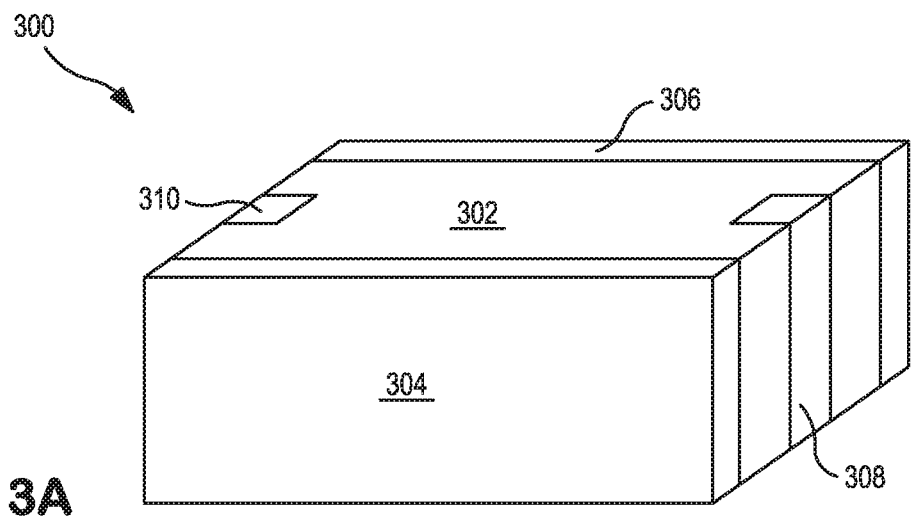
FIG. 3A illustrates an external perspective view of another exemplary embodiment of a multiterminal multilayer device in accordance with presently disclosed subject matter.
Figure 3B:
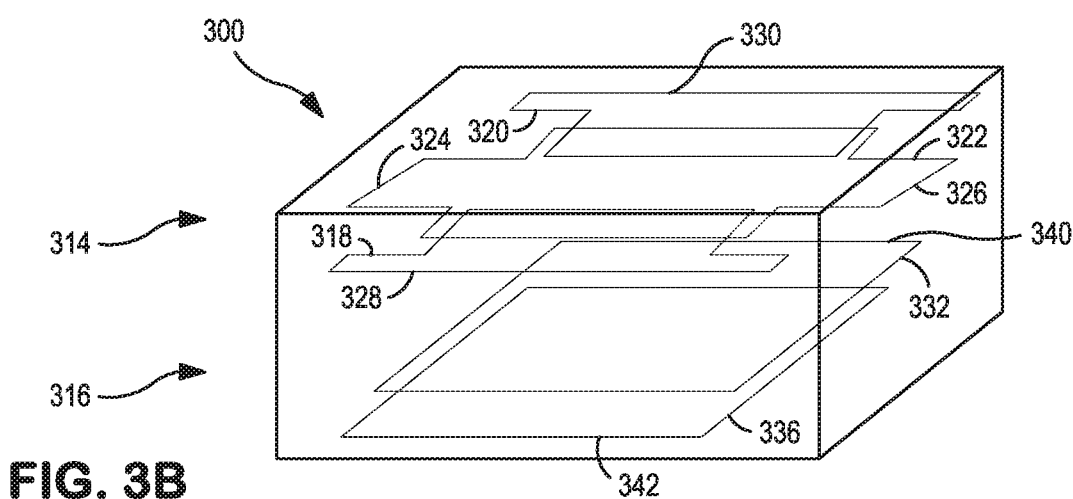
FIG. 3B illustrates a perspective view of the exemplary embodiment of application FIG. 3A, with partial transparent view to illustrate multiple components formed by multilayer construction therein.
Figure 3C:
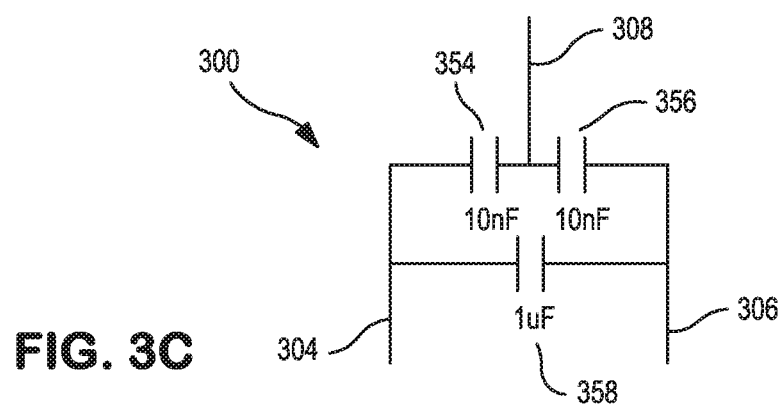
FIG. 3C illustrates a schematic view of the exemplary embodiment of application FIG. 3A.

FIG. 3A illustrates an external perspective view of another exemplary embodiment 300 of a multiterminal multilayer device in accordance with presently disclosed subject matter. FIG. 3B illustrates a perspective view of such exemplary embodiment 300 of application FIG. 3A, with partial transparent view to illustrate multiple components formed by multilayer construction therein, while FIG. 3C illustrates a schematic view of the exemplary embodiment 300 of application FIG. 3A.

More particularly, the alternative embodiment device 300 of presently disclosed subject matter may be regarded as a so-called reverse arrangement configuration, which results in relatively lower inductance, as understood by those of ordinary skill in the art. In comparison with the exemplary embodiment 100 of application FIGS. 1A and 1B, the elongated sides of exemplary body 302, such as the six-sided body 302, are terminated by external terminations 304 and 306, while the stripped external terminations 308 and 310 are formed on respective short side ends of body 302. Similar to application FIG. 1B, device 300 has multiple components formed by multiple layers in respective lower and upper regions 314 and 316, respectively, thereof. However, such layers are relatively rotated 90 degrees in comparison with the internal multilayer structures of device 100, with reference to the relatively elongated and relatively shortened sides thereof.

Further, the partial transparent view of FIG. 3A illustrates multiple components formed by multilayer construction therein, including upper region generally 314 of device 300 which internally provides a split feedthrough type construction resulting in two respective exemplary capacitors, and including a lower region generally 316 of device 300 which internally provides more of a standard overlap multilayer capacitor construction. Thus, the representative alternative exemplary embodiment of present FIGS. 3A and 3B result again in integration of capacitive elements in a single package, such as a single cofired package.

Regarding upper region 314, a pair of complementary co-planar layers 318 and 320 (which may be generally T-shaped or otherwise shaped) are juxtaposed opposite a representative cross-shaped layer 322. As represented, side extending edges 324 and 326 of layer 322 are in respective contact with stripped/side external terminations 308 and 310, while front and back extending edges 328 and 330 of members 318 and 320, respectively, are in respective contact with elongated side terminations 304 and 306.

Regarding lower region 316, representative alternating layers 332 and 336 are in standard overlapped configuration for formation of a multilayer capacitor within such region 316 of device 300. Also as shown, respective ends thereof 340 and 342 are in contact with external elongated side terminations 304 and 306, respectively.

It is to be understood by those of ordinary skill in the art from the complete disclosure herewith that while device 300 is illustrated in an SMD configuration in FIG. 3A, such device 300 may be equally practiced in a leaded configuration, as represented by the exemplary embodiment of FIG. 1C.

Similar to FIG. 1D, FIG. 3C illustrates a schematic view of the exemplary embodiment generally 300 of application FIG. 3A, in the connection configuration thereof as shown by application FIG. 3A. More specifically, connections are listed as respective terminations 304, 308, and 306, for circuitry connections as shown in respective contact with series and parallel capacitors. The indicated capacitance values are intended as exemplary only, rather than limiting.

As illustrated, device 300 provides a single device solution for containing series and parallel capacitors. Upper region generally 314 of device 300 shows two representative 10 nF capacitors 354 and 356 formed by the split feedthrough configuration of representative layers 318, 322, and 330. Lower region generally 316 of device 300 shows a single representative 1 µF capacitor 358, such as would be formed from standard multilayer capacitor constructions.

FIG. 4A illustrates a perspective view of yet another exemplary embodiment generally 400 of presently disclosed subject matter, with partial transparent view to illustrate multiple components formed by multilayer construction therein. In particular, such exemplary embodiment 400 makes use of different overlap areas (relative to exemplary embodiment 200) in order to provide different resulting capacitances in an integrated device, such as an integrated cofired device.

More specifically, device 400 has a pair of series capacitors situated in a generally upper region 414 as well as a similar pair of series capacitors situated in a generally lower region 414', with regions 414 and 414' on either side of a central region generally 416 in which a single capacitor in parallel is formed. Accordingly, those of ordinary skill in the art will appreciate from the complete disclosure herewith that the internally configured embodiment of device 400 of application FIG. 4A may nonetheless be also used with a standard package size (or other) and external termination configuration as represented by application FIG. 1A.

More specifically, as shown in such FIG. 4, upper and lower regions generally 414 and 414' of device 400 internally provide respective split feedthrough type constructions resulting in two pairs of respective exemplary capacitors, while central or middle region generally 416 of device 400 between regions 414 and 414' internally provides more of a standard overlap multilayer capacitor construction. Thus, the representative exemplary embodiment of present FIG. 4 results in another exemplary embodiment of presently disclosed integration of capacitive elements in a single package, such as a single cofired package.

More specifically, regarding upper region 414, a pair of layers 418 and 420, such as generally rectangular co-planar layers 418 and 420, is juxtaposed opposite a representative cross-shaped layer 422. As represented, front and back extending edges 424 and 426 of layer 422 would be in respective contact with central external terminations 108 and 110 (of application FIG. 1A), while side extending edges 428 and 430 are in respective contact with side/end terminations 104 and 106 (of application FIG. 1A). Similarly, regarding lower region 414', a pair of layers 418' and 420', such as generally rectangular layers 418' and 420', are juxtaposed opposite a representative cross-shaped layer 422'. As represented, front and back extending edges 424' and 426' of layer 422' would be in respective contact with central external terminations 108 and 110 (of application FIG. 1A), while side extending edges 428' and 430' are in respective contact with side/end terminations 104 and 106 (of application FIG. 1A).

Regarding middle or central region 416, paired alternating layers 432/434 and 436/438 are in standard overlapped configuration for formation of a multilayer capacitor within such region 416 of device 400. Also as shown, respective ends thereof 440 and 442 are in contact with external end termination 104 (of application FIG. 1A), while respective ends thereof 444 and 446 are in contact with external end termination 106 (of application FIG. 1A).

Similar to the potential alternative mounting of application embodiment 100 of FIG. 1A in a leaded configuration of application FIG. 1C, device 400 of application FIG. 4A may be mounted as a surface mount device, or associated with leads in the configuration of application FIG. 1C.

FIG. 4B illustrates a top elevation view of selected layers within the upper region 414 generally of the multilayer construction of the exemplary embodiment 400 of FIG. 4A. More specifically, representative layers 418, 420, and 422 are shown. As understood by those of ordinary skill in the art, the amount of surface area overlapped between opposing layers contributes to determining the value of resulting capacitance formed thereby. In this instance, the respective layers 418, 420, and 422 are configured as shown such that a greater overlap area 423 resides on one side of region 414 than for the overlap area 425 residing on the other side of region 414. As is understood, such different overlap area help form different capacitances, as otherwise reflected herein. Specifically, FIG. 4C illustrates a schematic view of the exemplary embodiment 400 of application FIGS. 4A and 4B. As shown, the two series capacitances formed are of unequal value, as a reflection of the uneven degrees of respective overlap for areas 423 and 425. While variations may be practiced, the exemplary embodiment 400 illustrated results in example capacitances for capacitors 454 and 456 of 20 nF and 10 nF, respectively, and 1 µF for capacitor 458. While a leaded configuration may be practiced, terminations 404, 408, and 406 are represented in the schematic view of FIG. 3C, to reflect a surface mount device configuration of embodiment 400.

Figure 5A:
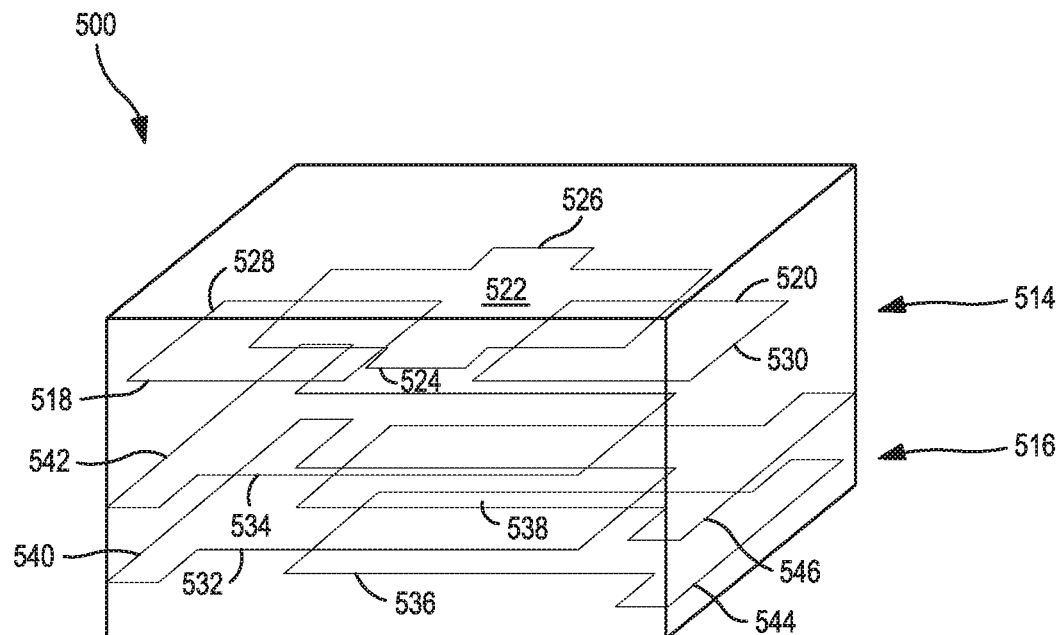
FIG. 5A illustrates a perspective view of yet another exemplary embodiment of presently disclosed subject matter, with partial transparent view to illustrate multiple components formed by multilayer construction therein.

FIG. 5A illustrates a perspective view of yet another exemplary embodiment 500 of presently disclosed subject matter, with partial transparent view to illustrate multiple components formed by multilayer construction therein. In particular, relatively enlarged electrodes (such as T-shaped designs) may be used to increase the relative degree of overlap, to thereby correspondingly increase capacitance values. They may also be used to provide other beneficial characteristics including, but not limited to, reducing the inductance and/or the equivalent series resistance (ESR).

More specifically, as shown in such FIG. 5A, an upper region generally 514 of device 500 internally provides a split feedthrough type construction resulting in two respective exemplary capacitors, while a lower region generally 516 of device 500 internally provides an overlap multilayer capacitor construction. Thus, the representative exemplary embodiment of present FIG. 5A results in integration of capacitive elements in a single package, such as a single cofired package.

More specifically, regarding upper region 514, a pair of layers 518 and 520, such as generally rectangular layers 518 and 520, is juxtaposed opposite a representative cross-shaped layer 522. As represented, front and back extending edges 524 and 526 of layer 522 are in respective contact with central external terminations 108 and 110 (application FIG. 1A for SMD configuration), while side extending edges 528 and 530 are in respective contact with side/end terminations 104 and 106 (application FIG. 1A).

Regarding lower region 516, paired alternating layers 532/534 and 536/538 are in standard overlapped configuration for formation of a multilayer capacitor within such region 516 of device 500. Also as shown, respective ends thereof 540 and 542 are in contact with external end termination 104 (application FIG. 1A), while respective ends thereof 544 and 546 are in contact with external end termination 106 (application FIG. 1A).

Figure 5B:
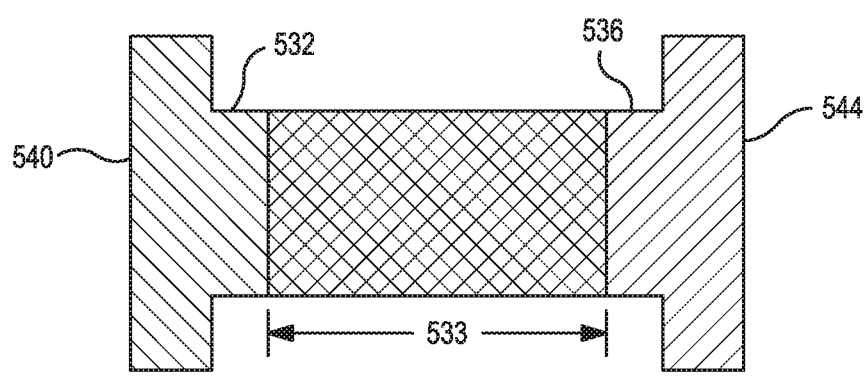
FIG. 5B illustrates a top elevation view of selected layers within the multilayer construction of the exemplary embodiment of FIG. 5A.

FIG. 5B illustrates a top elevation view of selected layers 532 and 536 within the lower region 516 of multilayer construction of the exemplary embodiment 500 of FIG. 5A. While various shapes may be practiced, as shown such capacitor electrode layers 532 and 536 may in some instances comprise T-shaped layers. As understood by those of ordinary skill in the art, overlap region or area 533 contributes to forming the resulting capacitance, such that relatively enlarging such overlap area relatively increases corresponding capacitance values (if all other factors are constant). They may also be used to provide other beneficial characteristics including, but not limited to, reducing the inductance and/or the equivalent series resistance (ESR).

Figure 6A:
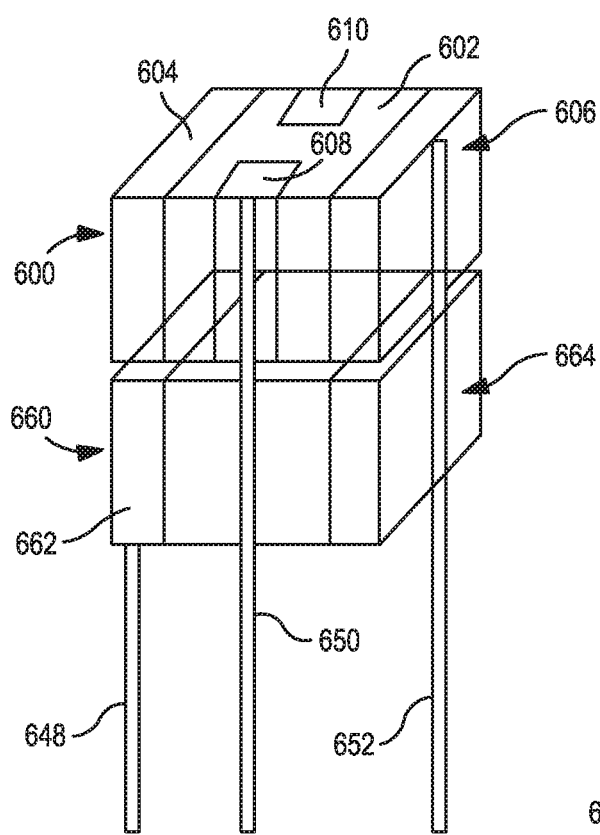
FIG. 6A illustrates an external perspective view of an exemplary embodiment of a multiterminal multilayer device in accordance with presently disclosed subject matter, for use in a stacked configuration with a varistor device, all for use with added leads, as illustrated.

As otherwise disclosed herewith, the addition of exemplary embodiments herewith in parallel with a discrete varistor, such as a discrete cofired varistor, element helps to provide transient protection to the resulting combination. More specifically, FIG. 6A illustrates an external perspective view of an exemplary embodiment of a multiterminal multilayer device generally 600 in accordance with presently disclosed subject matter, for use in a stacked configuration with a varistor device generally 660, all for use with respective added leads 648, 650, and 652, as illustrated. As discussed further herein, FIG. 6B illustrates a schematic view of the exemplary embodiment 600 of application FIG. 6A.

FIG. 6A illustrates an external perspective view of an exemplary embodiment of a multiterminal multilayer device generally 600 in accordance with presently disclosed subject matter. As illustrated, the exemplary embodiment 600 generally has body, such as a six-sided body, generally 602, with external terminations 604, 606, 608, and 610. Device 600 in the exemplary embodiment illustrated may comprise a multiterminal multilayer ceramic device, such as a cofired multilayer ceramic device, which is provided with three or more capacitive elements. In some such embodiments, such three capacitors may involve two capacitors in series, which are in parallel with a third element.

FIG. 6A also illustrates a perspective view of the exemplary embodiment 600, with added varistor device generally 660. Such device 660 may also have a standard 1206 case size, or other standard or non-standard case size. As shown, varistor 660 also has external terminations generally 662 and 664. Further per FIG. 6A, a lead configuration arrangement may be used to place device 600 and varistor 660 in parallel relative to each other. More specifically, leads 648, 650, and 652 are respectively attached to external (capacitor device) terminations 604, 608, and 606 of device 600, while leads 648 and 652 respectively connected as shown to external side (varistor) terminations 662 and 664 of varistor 660. The resulting configuration of application FIG. 6A is an overmolded three leaded component.

Figure 6B:
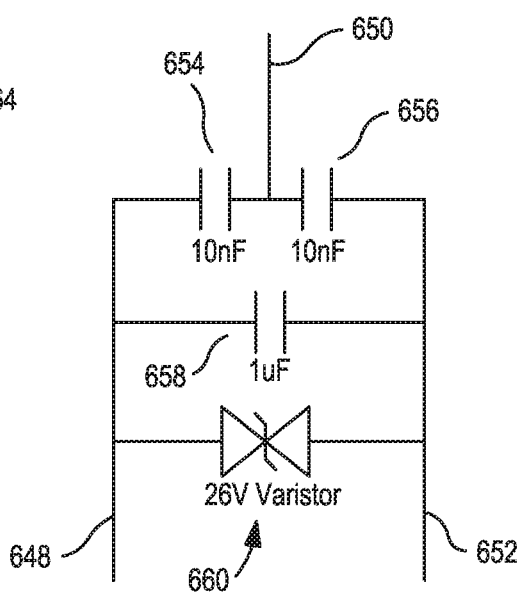
FIG. 6B illustrates a schematic view of the exemplary embodiment of application FIG. 6A.

FIG. 6B illustrates a schematic view of the exemplary embodiment generally 600 of application FIG. 6A, in the connection/mounting configuration thereof as shown by application FIG. 6A. More specifically, leads 648, 650, and 652 are shown in respective contact with series and parallel capacitors. The indicated capacitance values are intended as exemplary only, rather than limiting. Varistor 660 is likewise in contact with leads 648 and 652 as illustrated, so as to be in parallel relationship with device 600. The indicated varistor characteristics are intended as exemplary only, rather than limiting.

Figure 6C:
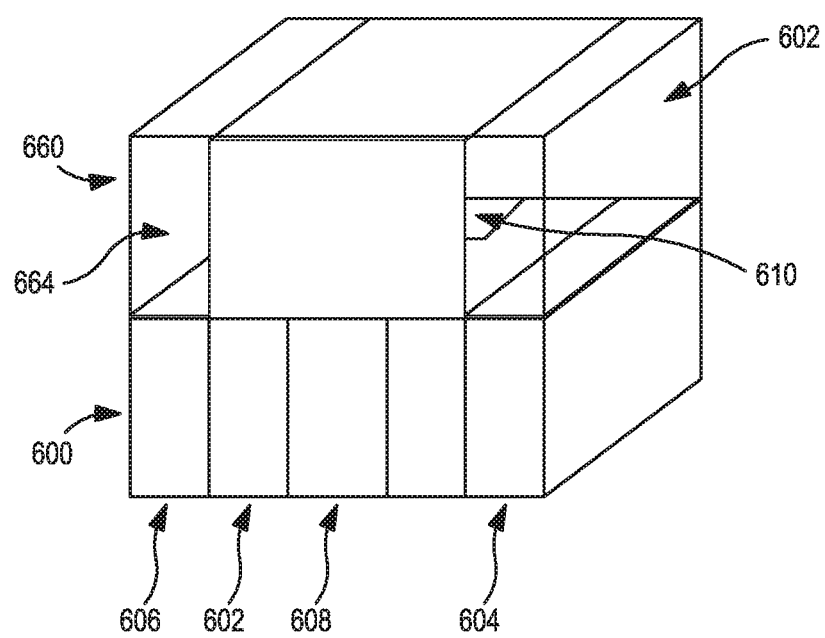
FIG. 6C illustrates an external perspective view of an exemplary embodiment of a multiterminal multilayer device in accordance with presently disclosed subject matter.

FIG. 6C illustrates a perspective view of a multiterminal multilayer device. In general, FIG. 6C illustrates the device of FIG. 6A in another perspective. For instance, the embodiment of FIG. 6C provides device 600, such as a multilayer ceramic device, on bottom with varistor 660 on top. Such a configuration can allow for use as a surface mount device after combining, such as via soldering, device 600 and varistor 660 together. Additionally, the embodiment as illustrated in FIG. 6C is provided without the leads illustrated in FIG. 6A. However, it should be understood that leads may also be employed when in such a configuration.

As illustrated, device 600 provides a single device solution for containing series and parallel capacitors. Device 600 shows two representative 10 nF capacitors 654 and 656, such as may be formed by a split feedthrough configuration of multiple layers in an isolated region of device 600. Device 600 also provides as shown a single representative 1 μF capacitor 658, such as may be formed from standard multilayer capacitor constructions in another region of device 600.

While various sizes may be practiced for any of the exemplary embodiments disclosed herewith, device 600 and varistor 660 may be regarded as being representative of a standard MLC case size, for example, a 1206 case size. Of course, various sizes may be practiced in various embodiments, as needed or desired for a particular application. All such variations and variations of exemplary capacitance values are intended to come with the spirit and scope of the presently disclosed subject matter.

As shown by the disclosure herewith, for some embodiments where used in an SMD arrangement, the presently disclosed subject matter may result in replacement of multiple discrete components on a printed circuit board (PCB), thereby saving space and in some instances lowering inductance. All of such presently disclosed exemplary embodiments may in some uses thereof by packaged in overmolded three leaded components. Per presently disclosed subject matter, a substantial reduction in device size is obtained, which results in reduction in the number of solder joints, which correspondingly increases reliability.

Also, individual steps in achieving the disclosed configurations are only intended as representative thereof, and do not denote required use of other aspects beyond the general nature of the disclosure otherwise indicated. For example, those of ordinary skill in the art will recognize that selected steps may be practiced to produce a particular design selected for a given application of the presently disclosed subject matter.

While such presently disclosed subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the presently disclosed subject matter as would be readily apparent to one of ordinary skill in the art.

What is claimed is:

1. An integrated capacitor filter with varistor functionality, comprising:
a discrete multiterminal multilayer ceramic capacitor device with multiple capacitive elements, comprising a body having cooperating multiple layers including electrode layers which in turn form integrated capacitive structures; a first pair of capacitor device terminations external to said body and having opposite polarity; a second pair of capacitor device terminations external to said body and having the same polarity; a first region of said electrode layers forming two respective capacitors; and a second region of said electrode layers forming a multilayer ceramic capacitor received in series connection between said first pair of terminations; and
a discrete varistor comprising a body having a pair of varistor terminations external to said varistor body and having opposite polarity,
wherein said varistor is stacked with said multiterminal multilayer ceramic capacitor device in contact with said first pair of capacitor device terminations such that said varistor is in parallel relationship with said multiterminal multilayer ceramic capacitor device.

2. An integrated capacitor filter with varistor functionality as in claim 1, wherein said first pair of capacitor device terminations and at least one of said second pair of capacitor device terminations are in respective parallel connections with said two respective capacitors of said first region.

3. An integrated capacitor filter with varistor functionality as in claim 1, wherein:
said first region of said electrode layers forms a split feedthrough type construction of said two respective capacitors; and
said second region of said electrode layers forms an overlap type construction of said multilayer ceramic capacitor.

4. An integrated capacitor filter with varistor functionality as in claim 1, further comprising:
first and second leads respectively attached to said first pair of capacitor device terminations and said pair of varistor terminations; and
a third lead attached to at least one of said second pair of capacitor device terminations.

5. An integrated capacitor filter with varistor functionality as in claim 1, wherein said varistor and said multiterminal multilayer ceramic capacitor device are combined so as to form a surface mount device (SMD) configuration for said filter.

6. An integrated capacitor filter with varistor functionality as in claim 1, wherein said first region of said electrode layers comprises at least a pair of layers situated opposite a generally cross-shaped layer having respective front and back extending edges in respective contact with said second pair of terminations, and having side extending edges in respective contact with said first pair of terminations.

7. An integrated capacitor filter with varistor functionality as in claim 6, wherein said pair of layers of said first layer have respectively different overlap areas with said generally cross-shaped layer of said first layer so that different capacitance values result for said respective capacitors of said first region.

8. An integrated capacitor filter with varistor functionality as in claim 7, further comprising:
a third region of said electrode layers forming a split feedthrough type construction of an additional two respective capacitors, said third region comprising at least a pair of layers having respective front and back extending edges in respective contact with said second pair of terminations, and having side extending edges in respective contact with said first pair of terminations;
wherein said pair of layers of said third layer have respectively different overlap areas with said generally cross-shaped layer of said third layer so that different capacitance values result for said respective additional capacitors of said third region.

9. An integrated capacitor filter with varistor functionality as in claim 6, wherein the pair of layers of the first region are T-shaped.

10. An integrated capacitor filter with varistor functionality as in claim 6, wherein the body has a pair of opposing side surfaces and the second pair of terminations are respectively formed on the pair of opposing side surfaces, and wherein the pair of layers of the first region respectively connect with the first pair of terminations along the pair of opposing side surfaces of the body.

11. An integrated capacitor filter with varistor functionality as in claim 1, wherein said second region of said electrode layers comprises at least paired alternating layers in an overlapped configuration with respective extending portions thereof in contact with respective of said first pair of terminations.

12. An integrated capacitor filter with varistor functionality as in claim 11, wherein the paired alternating layers of the second region are T-shaped.

13. An integrated capacitor filter with varistor functionality as in claim 11, wherein the body has a pair of opposing side surfaces and the second pair of terminations are respectively formed on the pair of opposing side surfaces, and wherein the paired alternating layers of the second region respectively extend to the pair of opposing side surfaces of the body, and wherein the paired alternating layers of the second region respectively connect with the first pair of terminations along the pair of opposing side surfaces of the body.

14. An integrated capacitor filter with varistor functionality as in claim 1, wherein said two respective capacitors of said first region are in series with each other, and both in parallel with said multilayer ceramic capacitor of said second region.

15. An integrated capacitor filter with varistor functionality as in claim 1, further comprising:
a third region of said electrode layers forming a split feedthrough type construction of an additional two respective capacitors;
wherein said first pair of terminations and at least one of said second pair of terminations are in respective parallel connections with said additional two respective capacitors of said third region.

16. An integrated capacitor filter with varistor functionality as in claim 1, wherein said second region of said electrode layers is between said first and third regions of said electrode layers.

17. An integrated capacitor filter with varistor functionality as in claim 1, wherein:
said body has a pair of relatively elongated sides and a pair of relatively shorter sides;
said first pair of terminations reside respectively on said pair of relatively elongated sides; and
said second pair of terminations resides respectively on said pair of relatively shorter sides.

18. An integrated capacitor filter with varistor functionality as in claim 1, wherein said electrode layers of said second region include relatively enlarged areas for forming a relatively increased capacitance value overlap type multilayer ceramic capacitor.

19. A method for providing an integrated capacitor filter with varistor functionality, comprising:
providing a multiterminal multilayer ceramic device with multiple capacitive elements, wherein providing a multiterminal multilayer ceramic device with multiple capacitive elements comprises:
providing a body having cooperating multiple layers including electrode layers which are used to form integrated capacitive structures;
forming a split feedthrough type construction of two respective capacitors in a designated first region of said electrode layers;
forming an overlap type construction of a multilayer ceramic capacitor in a designated second region of said electrode layers;
applying a first pair of terminations external to a pair of respective opposing sides of said body, and with said second region capacitor connected in series between said first pair of terminations; and
applying a second pair of terminations external to at least portions of another pair of respective opposing sides of said body and having the same polarity, and with at least one of said second pair of terminations and said first pair of terminations in respective parallel connections with said two respective capacitors of said first region, so that multiple capacitive elements are integrated in a single package device; and
stacking a discrete varistor with a pair of external terminations relative to said multiterminal multilayer ceramic such that said varistor is in contact with said first pair of terminations and in parallel relationship with said multiterminal multilayer ceramic capacitor device.

20. The method as in claim 19, wherein:
said first region of said electrode layers comprises at least a pair of layers situated opposite a generally cross-shaped layer having respective front and back extending edges in respective contact with said second pair of terminations, and having side extending edges in respective contact with said first pair of terminations; and
said second region of said electrode layers comprises at least paired alternating layers in an overlapped configuration with respective extending portions thereof in contact with respective of said first pair of terminations.

21. The method as in claim 19, further comprising forming another split feedthrough type construction of two respective capacitors in a designated third region of said electrode layers, with said two respective capacitors of said third region connected respectively in parallel relative to at least one of said second pair of terminations and said first pair of terminations.

22. The method as in claim 20, further including providing said pair of layers of said first layer with respectively different overlap areas with said generally cross-shaped layer of said first layer so that different capacitance values result for said respective capacitors of said first region.

23. The method as in claim 19, further comprising forming a split feedthrough type construction of an additional two respective capacitors in a designated third region of said electrode layers, said third region comprising at least a pair of layers having respective front and back extending edges in respective contact with said second pair of terminations, and having side extending edges in respective contact with said first pair of terminations.

24. The method as in claim 19, wherein said first and second leads respectively are attached to said pair of external terminations of said varistor.

25. The method as in claim 19, further comprising combining said varistor and said multiterminal multilayer ceramic capacitor device so as to form a surface mount device (SMD) configuration for said filter.

* * * * *